United States Patent
De Souza et al.

(10) Patent No.: US 6,789,227 B2
(45) Date of Patent: Sep. 7, 2004

(54) SYSTEM AND METHOD FOR GENERATING LOW DENSITY PARITY CHECK CODES USING BIT-FILLING

(75) Inventors: Jorge Campello De Souza, San Jose, CA (US); Dharmendra Shantilal Modha, San Jose, CA (US); Sridhar Rajagopalan, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 296 days.

(21) Appl. No.: 09/899,459

(22) Filed: Jul. 5, 2001

(65) Prior Publication Data

US 2003/0014718 A1 Jan. 16, 2003

(51) Int. Cl.$^7$ ................................................ G06F 11/00
(52) U.S. Cl. ...................... 714/804; 714/800; 714/758
(58) Field of Search ........................................ 714/804

(56) References Cited

U.S. PATENT DOCUMENTS 3,542,756 A * 11/1970 Gallager ..................... 714/762
4,295,218 A * 10/1981 Tanner ....................... 714/762

OTHER PUBLICATIONS

"Comparison of Constructions of Irregular Gallager Codes", David J. C. MacKay et al., Oct., 1999, IEEE Transactions of Communications, vol. 47 No. 10, pp 1449–1454.*
"A heuristic Search for Good Low–Density Parity–Check Codes at Short Block Lengths", Yongyi Mao, Jun. 11–14, 2001, IEEE International Conference on Communications, vol. 1, pp 41–44.*
"Design of Capacity–Approaching Irregular Low–Density Parity–Check Codes", Thomas J. Richardson et al., Feb., 2001, IEEE Transactions on Information Theory, vol. 47, No. 2, pp 619–637.*
"Low Density Parity Check Codes: Construction Based on Finite Geometries", Yu Kow et al., IEEE Conference on Global Communications, Nov. 27 to Dec. 1, 2000, vol. 2, pp 825–829.*
"Improved Low– Density Parity–Check Codes Using Irregular Graphs", Michael G. Luby et al., Feb., 2001, IEEE Transactions on Information Theory, vol. 47, No. 2, pp 585–596.*
"Efficient Encoding of Low–Density Parity–Check Codes", Thomas J. Richardson et al., Feb., 2001, IEEE Transactions on Information Teory, vol. 47, No. 2, pp 638–656.*
"Construction of LDPC Codes Using Ramanjan Graphs and Ideas from Margulis", Joachim Rosenthal et al., Oct. 3, 2000, Procedures of 38$^{th}$ Allerton Conference on Communication, Control and Computing, Monticello, Illinois.*
"Parallel Decoding Architectures for Low Density Parity Check Codes", C. Howland, IEEE International Symposium on Circuits and Systems2001, May 6–9, 2001, pp 742–745.*

* cited by examiner

*Primary Examiner*—Albert Decady
*Assistant Examiner*—John P Trimmings
(74) *Attorney, Agent, or Firm*—John L. Rogitz

(57) ABSTRACT

A computer-implemented system and method is for generating low-density parity check (LDPC) codes. One aspect of the invention includes a method for generating high rate LDPC codes that first constructs a matrix (H) of size m×n having m rows of check nodes and n columns of bit nodes. The matrix meets the following requirements: the weight of the $j^{-th}$ column equals $a_j$; each row, r, has weight at most $b_r$; and the matrix H can be represented by a Tanner graph that has a girth of at least $g \geq g$. The method then iteratively adds an $(n+1)^{th}$ column ($U_1$) to matrix H, wherein the size of $U_1$, is initially empty and is at most $a_{n+1}$, and wherein $U_1$, comprises a set of i check nodes such that i is greater than or equal to 0 and i is less than $a_{n+1}$. The method then iteratively adds check nodes to $U_1$. such that each check node does not violate predetermined girth and check-degree constraints. The matrix H is updated when a new column is added. The iterations are terminated if there are no new check nodes that do not violate the girth and check-degree constraints. The method can be modified to optimize various parameters, including the following cases: maximizing the rate for a fixed girth; maximizing the girth for a fixed rate; and maximizing the rate for a fixed girth and fixed length.

16 Claims, 5 Drawing Sheets

```
1:  set n = 0, A = |m|, and U₁ = φ, g = ḡ
2:  for c ∈ |m|, set w(c) = 0 and N_c = φ
3:  do {
4:      ∀c ∈ U₁, set H_{c,n} = 1 and update w(c), deg(c)
5:      set i = 0, U₁ = φ, and U = φ
6:      do {
7:          compute F₀ = A \ U
8:          if (F₀ ≠ φ) {
9:              choose c* from F₀ according to some heuristic
10:             ∀c ∈ U₁, update N_c = N_c ∪ {c*} and update N_{c*} = N_{c*} ∪ U₁
11:             update U₁ = U₁ ∪ {c*}, U = U ∪ V_{(g/2)-1}(c*), and A
12:             i = i + 1
12:         } else{
13:             g = g - 2
14:             recalculate U = ∪_{1 ≤ j ≤ (g/2)-1} U_j
14:         }
15:     } while ((i < a_n) and (g ≥ ḡ))
16:     n = n + 1
17: } while ((n < N) and (g ≥ ḡ))
```

```
1:  set n = 0, A = |m|, and U_1 = φ, g = ḡ
2:  for c ∈ |m|, set w(c) = 0 and N_c = φ
3:  do {
4:    ∀c ∈ U_1, set H_{c,n} = 1 and update w(c), deg(c)
5:    set i = 0, U_1 = φ, and U = φ
6:    do {
7:      compute F_0 = A \ U
8:      if (F_0 ≠ φ) {
9:        choose c* from F_0 according to some heuristic
10:       ∀c ∈ U_1, update N_c = N_c ∪ {c*} and update N_{c*} = N_{c*} ∪ U_1
11:       update U_1 = U_1 ∪ {c*}, U = U ∪ V_{(g/2)-1}(c*), and A
12:       i = i + 1
12:     } else {
13:       g = g - 2
14:       recalculate U = ∪_{1≤j≤(g/2)-1} U_j
14:     }
15:   } while ((i < a_n) and (g ≥ g̲))
16:   n = n + 1
17: } while ((n < N) and (g ≥ g̲))
```

FIG. 3

$$U_j = \bigcup_{c \in U_{j-1}} \mathcal{N}_c. \qquad (1)$$

$$U = \bigcup_{1 \leq j \leq (g/2)-1} U_j \qquad (2)$$

$$U_j(c) = \bigcup_{c' \in U_{j-1}(c)} \mathcal{N}_{c'} \qquad (3)$$

$$V_{(g/2)-1}(c) = \bigcup_{1 \leq j \leq (g/2)-1} U_j(c). \qquad (4)$$

$$F_1 = \{c_1 \in F_0 : \forall c_2 \in F_0, w(c_1) \leq w(c_2)\} \qquad (5)$$

FIG. 4

9A: set $j = 0$, $E_0 = F_0$
9B: $\forall c \in F_0$, set $U_1(c) = \{c\}$
9C: while $((|F_j| > 1)$ and $(E_j = F_j))$ {
9D: $\quad j = j + 1$
9E: $\quad \forall c \in F_{j-1}$,
$\qquad$ compute $W_j(c) = \sum_{c' \in V_j(c)} w(c')$
9F: $\quad$ compute $F_j =$
$\qquad \{c_1 \in F_{j-1} : \forall c_2 \in F_{j-1}, W_j(c_1) \leq W_j(c_2)\}$
9G: $\quad \forall c \in F_j$, compute $V_{j+1}(c)$ using (4)
9H: $\quad$ compute $E_j = \{c \in F_j : V_{j+1}(c) \neq V_j(c)\}$
9I: } endwhile
9J: if $(|F_j| = 1)$
9K: $\quad$ select $c^*$ from $F_j$
9L: else
9M: $\quad$ select $c^*$ from $F_j \setminus E_j$
9N: endif

FIG. 5

$$H = \begin{bmatrix} 1 & 0 & 0 & 1 & 0 & 1 & 1 \\ 0 & 1 & 0 & 1 & 1 & 1 & 0 \\ 0 & 0 & 1 & 0 & 1 & 1 & 1 \end{bmatrix} \begin{matrix} 1 \\ 2 \\ 3 \end{matrix}$$
bit nodes (columns 1–7), check nodes (rows 1–3)
FIG. 6A
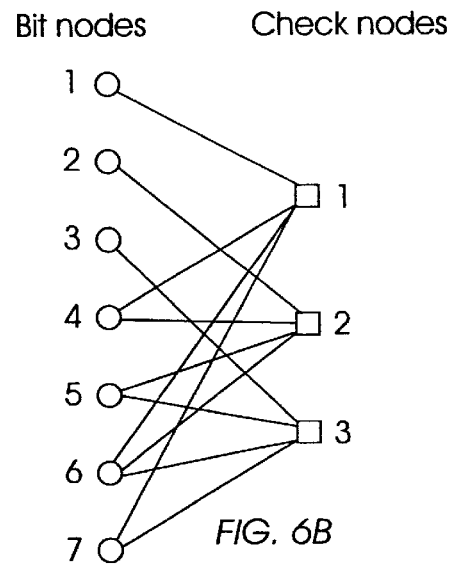
FIG. 6B
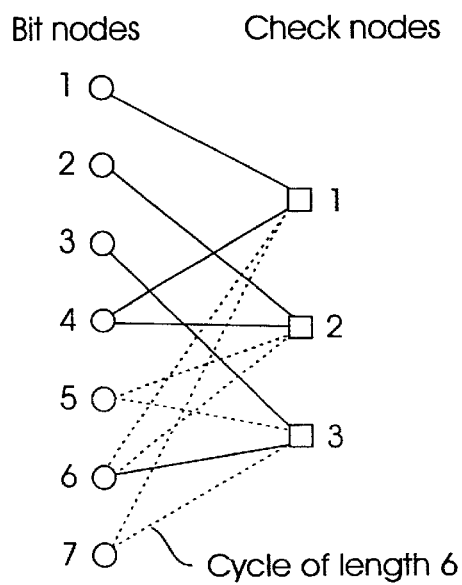
Cycle of length 6
FIG. 6C
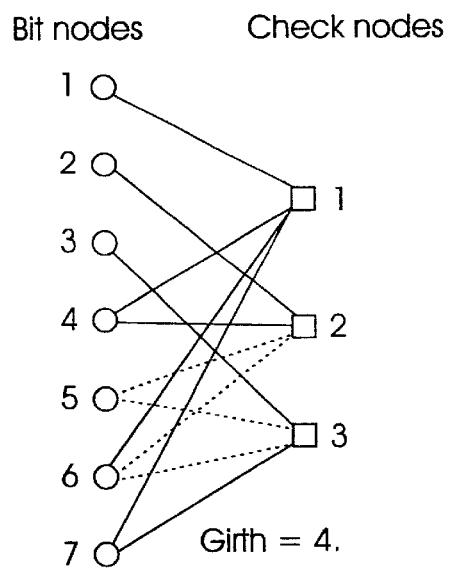
Girth = 4.
FIG. 6D
```
1 0 1 ...
0 0 0
1 0 1
...
etc.
```
FIG. 6E

SYSTEM AND METHOD FOR GENERATING LOW DENSITY PARITY CHECK CODES USING BIT-FILLING

BACKGROUND OF THE INVENTION

1. Field of the Invention

The present invention relates generally to data error detection and correction, and more particularly to a system and method of generating low density parity check (LDPC) codes using a bit filling technique.

2. Description of the Related Art

It is well known that the probability of errors in digital data transmission increases as the signal-to-noise ratio worsens. Since it is not always practical to reduce noise in the transmission path, techniques for dealing with errors in a received signal have been developed. Many of these techniques, referred to as error control codes, involve the transmission of redundant digits, which do not themselves convey information but make it possible for errors to be controlled at the receiver. Some error control codes detect errors and some detect and correct errors.

One class of error correction codes (ECCs) that both detect and correct errors is known as the "Hamming Codes", which are widely used for error detection and correction in digital communications data storage systems. The Hamming Codes are capable of detecting multiple bit errors and correcting single bit errors. Another well known ECC algorithm is the "Reed-Solomon code", widely used for error correction in the compact disk industry. The Reed-Solomon code is able to correct multiple errors per word. Other conventional ECC algorithms include the "b-adjacent" error correction code, and the "odd weight column" code.

One example of an application of an error correction technique commonly used for computer memory systems is known as a Redundant Array of Independent Disks (RAID), wherein a number of small disk drives are used to store data with the data being spread across a number of the disk drives. When data is received from a host computer by a RAID controller, it typically arrives in 8-bit byte form, with a ninth, parity bit for each byte. The controller writes the data across a number of disks, putting different blocks of data in different disks. As the RAID controller writes the data it will typically generate a check code, such as a Cyclic Redundancy Check (CRC). This is basically an exclusive OR (XOR) of each bit position in successive bytes throughout a sector. Another example is linear parity, which is an exclusive OR function of successive words of any convenient length. The aforementioned Reed Solomon codes may also be used in RAID systems.

In addition to these check codes, the RAID controller also provides a parity calculation. The parity is the exclusive OR of the data blocks in each disk drive, with the exclusive OR being a parity block which is stored on a separate parity disk. The parity calculation is usually done not only on the data itself, but also on the check codes, which are stored with the data on each disk drive.

One type of error correction utilizes Low Density Parity Check (LDPC) Codes, which were first introduced in 1963. Initial approaches of designing LDPC codes used a construction that had a fixed weight for all the columns of the parity-check matrix. Recently, it has been shown that LDPC codes can perform very close to the Shannon capacity limit when their associated Tanner graphs posses certain desirable properties. Tanner graphs are bipartite graphs that can be used to represent a parity check matrix of LDPC codes. One desirable property is that Tanner graphs have a large "girth", which is the smallest cycle in the graph. This is important because when decoding LDPC codes using the sum-product decoding algorithm, the number of independent iterations of the algorithm is proportional to the girth of the Tanner graph corresponding to the code. Another desirable property is high "rate". For a code with a parity check matrix having m rows and n columns, the rate, R, is given by $$R = \frac{(n-m)}{n}.$$

U.S. Pat. Nos. 4,295,218 and 3,542,756, both of which are incorporated herein by reference, disclose decoding methods with which the present invention can be used.

Various recent approaches to designing LDPC codes include the use of a fixed girth parity check matrix with a random construction, the design of irregular graphs using random constructions and linear programming, as well as the design of LDPC codes using either array codes, Steiner designs or finite geometries.

The above-discussed techniques for designing LDPC codes typically have exponential time complexity. As a result, they can only be made to work for small parity check column weights and for small girth values. Also, the prior techniques also do not usually yield a satisfactorily high rate. Furthermore, these techniques do not offer sufficient flexibility to permit one to choose codes with certain fixed values, such as girth, and then design the codes with various other desirable parameters optimized. As a result, using conventional techniques cannot choose to trade-off, for example, bit error rate performance against the code rate. An added feature of our technique is that cycles are only formed if necessary. The algorithm starts out using a large girth constraint, $\bar{g}$, and then decreases the girth constraint as needed throughout the execution of the algorithm. As a result, the girth is always as high as possible, and the number of short cycles formed is small.

The present invention has carefully considered the above problems and has provided the solution set forth herein.

SUMMARY OF THE INVENTION

A computer-implemented system and method is disclosed for generating low-density parity check (LDPC) codes. One aspect of the invention includes a method for generating high rate LDPC codes that first constructs a matrix (H) of size m×n having m rows of check nodes and n columns of bit nodes. The matrix meets the following requirements: the weight of the $j^{th}$ column equals $a_j$; each row, r, has weight at most $b_r$; and the matrix H can be represented by a Tanner graph that has a girth $g \geq \bar{g}$. The method then iteratively adds an $(n+1)^{th}$ column ($U_1$) to matrix H, wherein the size of $U_1$ g is initially empty and is at most $a_{n+1}$, and wherein $U_1$ comprises a set of i check nodes such that i is greater than or equal to 0 and i is less than $a_{n+1}$. The method then iteratively adds check nodes to $U_1$ such that each check node does not violate predetermined girth and check-degree constraints. The matrix H is updated when a new column is added. The iterations are terminated if there are no new check nodes that do not violate the girth and check-degree constraints. The method can be modified to optimize various parameters, including the following cases: maximizing the rate for a fixed girth; maximizing the girth for a fixed rate; and maximizing the rate for a fixed girth and fixed length.

In accordance with another aspect of the invention an LDPC code generator is provided for creating LDPC codes for use in an LDPC error correcting system that includes an LDPC encoder that receives digital data and encodes said data using the LDPC codes. The LDPC code generator includes a unit for generating an m×n matrix (H) having m rows of check nodes and n columns of bit nodes, wherein the weight of the $j^{th}$ column is $a_j$, each row, r, has weight at most $b_r$, and wherein the matrix H can be represented by a Tanner graph that has a girth of at least $g \geq g$. The LDPC code generator also includes a processing module for iteratively adding $(n+1)^{th}$ columns ($U_1$) to matrix H, wherein the size of $U_1$ is initially empty and is at most $a_{n+1}$, and wherein $U_1$ comprises a set of i check nodes such that i is greater than or equal to 0 and i is less than $a_{n+1}$. Another processing module iteratively adds check nodes to $U_1$ such that each check node does not violate predetermined girth and check-degree constraints. An additional processing module updates matrix H when a new column is added and another processing module terminates the iterations if there are no new check nodes that do not violate the girth and check-degree constraints, or if the desired number of bit nodes has been added.

The details of the present invention, both as to its structure and operation, can best be understood in reference to the accompanying drawings, in which like reference numerals refer to like parts, and in which:

BRIEF DESCRIPTION OF THE DRAWINGS

FIG. 3 shows a pseudocode representation of the bit filling process in accordance with a preferred embodiment of the invention;

FIG. 4 shows a set of equations used in accordance with the present invention;

FIG. 5 shows a pseudocode representation of the bit filling process in accordance with a preferred embodiment of the invention; and FIGS. 6A–6D show a set of bipartite graphs illustrating the principles of the invention.

FIG. 6E is a table showing binary numbers.

DETAILED DESCRIPTION OF THE PREFERRED EMBODIMENTS

Figure 1:
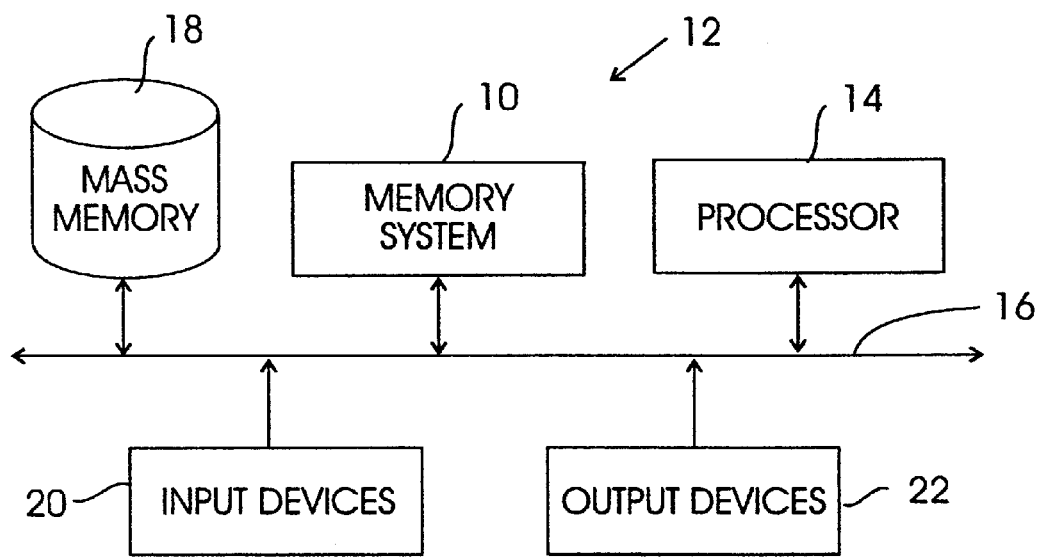
FIG. 1 is a block diagram of the architecture of the present invention.

Referring initially to FIG. 1, a memory system 10 is shown for providing reliable memory access within a computer system 12. The general computer architecture of the computer system 12 shown in FIG. 1 is in common use. Computer system 12 includes a processor 14 that is coupled through a bus 16 to the memory system 10. Processor 14 fetches computer instructions from the memory system 10 through bus 16 and executes the fetched computer instructions. Processor 14 also reads data from and writes data to memory system 10 and a mass memory unit 18, which is also coupled to bus 16.

Figure 2:
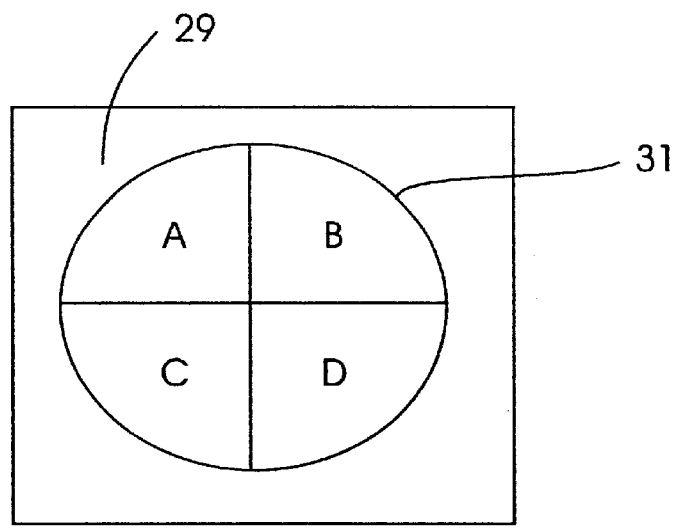
FIG. 2 is a schematic diagram of a computer program product.

The computer system 12 can be a personal computer made by International Business Machines Corporation (IBM) of Armonk, N.Y. Other digital processors, however, may be used, such as a laptop computer, mainframe computer, palmtop computer, personal assistant, or any other suitable processing apparatus. Computer system 12 also includes one or more user input devices 20, which can include without limitation a keyboard and an electronic pointing device such as a mouse, trackball, light pen, digitizing tablet, and /or touch-sensitive pad. A user manipulates input devices 20 to generate command signals through bus 16 to processor 14 which takes appropriate action in response thereto according to computer instructions fetched from memory system 10. In response to computer instructions from memory system 10, and sometimes in response to user generated command signals received from user input devices 20, processor 14 transmits data and control signals to one or more output devices 22 for display to a user. Output devices 22 can include without limitation printers and computer display devices such as cathode-ray tubes, light emitting diode displays and liquid crystal displays In any case, the processor 14 of the computer 12 accesses the memory device 10 to undertake the logic of the present invention, which may be executed by a processor as a series of computer-executable instructions. The instructions may be contained on a data storage device with a computer readable medium, such as a computer diskette 29 shown in FIG. 2 having a computer usable medium 31 with code elements A, B, C and D stored thereon. Or, the instructions may be stored on random access memory (RAM) of the computer 12, on a DASD array, or on magnetic tape, conventional hard disk drive, electronic read-only memory, optical storage device, or other appropriate data storage device. In an illustrative embodiment of the invention, the computer-executable instructions may be lines of C++ code.

Indeed, the pseudocode listings shown herein illustrate the structure of the logic of the present invention as embodied in computer program software. Those skilled in the art will appreciate that the pseudocode listings illustrate the structures of computer program code elements including logic circuits on an integrated circuit, that function according to this invention. Manifestly, the invention is practiced in its essential embodiment by a machine component that renders the program code elements in a form that instructs a digital processing apparatus (that is, a computer) to perform a sequence of function steps corresponding to those shown.

U.S. Pat. Nos. 4,295,218 and 3,542,756, incorporated herein by reference, describe error correcting schemes that can use the cod One type of parity check code is referred to as low-density parity check codes (LDPC). LDPC codes can perform very close to the Shannon capacity limit when their associated Tanner graphs possess certain desirable properties. A LDPC code can be described by specifying its parity check matrix H, which is an m×n binary matrix. The name "low density" refers to the fact that the matrix H is very sparse. The "length" of the LDPC code is n and its "rate" is (n−m)/n. Given a parity check matrix H, we can define its associated Tanner graph G(H)=(V,E) as a bipartite graph with m+n vertices V={1,2, . . . , m,m+1, . . . m+n}. The first m vertices correspond to m parity check equations, and are referred to as the check nodes. The last n vertices are referred to as the bit nodes. For $1 \leq i \leq m$ and $1 \leq j \leq n$, there is an edge (i, m+j) in E if and only if $H_{i,j}=1$. This is illustrated in FIGS. 6A and 6B, where we have a parity-check matrix and its corresponding Tanner graph.

FIG. 6C illustrates the concept of a cycle. In that figure there is a path from bit node 5 through several other nodes and back to bit node five. More specifically the path is b5-c2-b6-c1-b7-c3-b5. The length of a path is given by the number of edges traversed. In this example, the length of the path is 6. Since the path begins and ends at the same node, the path is called a cycle. The length of the smallest cycle in a graph is known as its girth. This concept is illustrated in FIG. 6D. The importance of large girth stems from the fact that when decoding LDPC codes using the sum-product-decoding algorithm, the number of independent iterations of the algorithm is proportional to the girth of the Tanner graph corresponding to the code. The present invention is concerned with the following design problem. Given positive integers $\{a\}=(a_1, a_2, \ldots, a_n)$, $\{b\}=(b_1, b_2, \ldots, b_m)$, n, and m; construct a m×n parity check matrix H with the largest possible girth such that H has exactly $a_j$ ones in each column $j=1,2, \ldots, n$, at most $b_r$ ones in row $r=1, 2, \ldots, m$.

The present invention utilizes a heuristic "Bit-Filling" algorithm for the above problem. This algorithm has a computational complexity of $O(bm^3)$, where $$b = \frac{1}{m}\sum_{r=1}^{m} b_r.$$

Alternatively, a simpler version can be implemented using $O(bm^2)$ operations. The techniques of the present invention contrasts with the various ad-hoc, random constructions commonly used, which often have exponential time complexity, and hence, can be made to work only for small column weights and for small values of g (for example, g=6). As a benchmark, the algorithm of the invention finds better or comparable rates to some of the highest rate codes disclosed by D. J. C. MacKay in "Encyclopedia of sparse graph codes," 1999.

The algorithm of the present invention can be easily adapted to the following important cases (as well as others): 1) "Fixed rate, high girth", which is defined as follows: Given the number of check nodes m, the number of bit nodes, the check-degree distribution {b}, and bit-degree distribution {a}

$$\left(\text{such that } \sum_{j=1}^{n} a_j = \sum_{r=1}^{m} b_r\right),$$

maximize the girth g; and 2) "Fixed girth, fixed length, high rate", which is defined as follows: Given the length of the code n, the bit-degree distribution {a}, and the girth g, minimize the number of check nodes, m, that is maximize the rate.

In brief, the general idea of the bit filling algorithm used in the present invention is to first consider that a matrix H with n columns, (n≧0) is already constructed which already satisfies all the constraints, that is, the weight of the $j^{th}$ column is exactly $a_j$, $j=1, 2, \ldots, n$, row r has weight at most $b_r$, $r=1, 2, \ldots, m$, and the associated Tanner graph $G\equiv G(H)$ has girth at least g>g. The techniques of the present invention include processes for adding $(n+1)^{th}$ column to H. The new column to be added is considered to be a set $U_1$ which has size as most $a_{n+1}$ and is initially empty. The set $U_1$ is a set of check nodes and hence is a subset of $m\equiv\{1, 2, \ldots, m\}$. Further, assume that i check nodes, $0\leq i < a_{n+1}$, have been already added to $U_1$. The following procedure attempts to add $(i+1)^{th}$ check node to $U_1$. It may fail, in which case the whole procedure stops.

FIG. 3 shows a pseudocode representation of the bit filling procedure outlined above in accordance with one embodiment of the invention. Each iteration of the outer "do . . . while" loop in lines 3–17 attempts to add a column to the parity check matrix. If an iteration succeeds, then, in the beginning of the next iteration, line 4 updates the matrix. Each iteration of the inner "do . . . while" loop in lines 6–15 attempts to add a check node to the set $U_1$.

To better understand the procedure it is helpful to think of the Tanner graph G; G has m check nodes and n bit nodes. The process of adding the $(n+1)^{th}$ column of H is like adding the $(n+1)^{th}$ bit node to G. In this context, $U_1$ can be thought of as the set of check nodes that have been already connected to the $(n+1)^{th}$ bit node that is being added. The process of adding a check node c* is like adding an edge from the $(n+1)^{th}$ bit to the $c^{*th}$ check node. This new edge must not create any cycles of length (g–2) or smaller. The following discussion describes a test to enforce this constraint.

For a check node $1\leq c\leq m$, let $N_c$ denote the set of all check nodes that share a bit node with it. In other words, $N_c$ is the set of all check nodes that are exactly two distinct edges away from c. For $j\geq 2$, define $U_j$ as shown in equation (1) in FIG. 4. Intuitively, there is a path of length 2 from every check node in $U_2$ to some check node in $U_1$. Now adding a check node c* to $U_1$ will create a path of length 2 from c* to every check node in $U_1$. So if c* is in $U_2$, then we are guaranteed a 4-cycle. Hence, to avoid 4-cycles, we should avoid the check nodes in $U_2$. Continuing in this fashion, there is a path of length 2 from every check node in $U_j$ to some check node in $U_{j-1}$, and hence there is a path of length at most 2j–2 from every check node in $U_j$ to some check node in $U_1$. Thus, adding a check node in $U_j$ to $U_1$ will create a cycle of length 2j or smaller. Hence, to satisfy the girth constraint, we should avoid adding check nodes in the set U, as defined in equation (2) in FIG. 4, to $U_1$.

Let deg(c) denote the degree of the check node c. Let $$A=\{c\epsilon\_|m|: deg(c)<b_c\}$$

denote the set of check nodes that are connected to fewer than the maximum allowed number of bit nodes. Then, the set of feasible check nodes that can be added to $U_1$ without violating the girth or the check-degree constraint is $$F_0 = A\backslash U$$

If $F_0$ is empty, the current girth is decreased, if g falls below g the procedure terminates. Before discussing the issue of how to select a check node from $F_0$, an efficient implementation of equation (2) will be discussed.

It can be observed that, as check nodes are added to $U_1$, it is computationally more efficient to incrementally update U in line 11 (FIG. 3) than recomputing it afresh using equations (1)–(2). Specifically, if we have added a check node c to $U_1$, then we set $U_1(c)=\{c\}$ and for $2\leq j\leq (g/2)-1$, compute $U_j(c)$ as shown in equation (3) in FIG. 4. Then compute $V_{(g/2)-1}(c)$ as shown in equation (4) in FIG. 4. Finally, update U using $U=U\cup V_{(g/2)-1}(c)$.

The main heuristic in accordance with the bit-filling algorithm will now be discussed. An important step of the bit filling algorithm is the choice of the check node $c^*\epsilon F_0$ in line 9 of FIG. 5. While any choice of c* from $F_0$ is valid, judicious selection of c* is crucial to achieving high performance codes. Technically, using back-tracking and recursion, every possible choice can be tried, and then "conditioned" on that choice try every future choice, etc., thus searching through an extremely large tree of possibilities. Unfortunately, while optimal, such exhaustive search is computationally infeasible. Also, a large number of choices actually lead to isomorphic graphs and are thus equivalent from our perspective. The role of heuristics is to pick one seemingly effective and yet computationally feasible, path through this huge tree of possibilities.

In accordance with one embodiment of the invention, we let the choice of c* in line 9 of FIG. 3 be guided by the simple principle of keeping the Tanner graph as homogeneous as possible, that is, from the set of all feasible check nodes, pick the check node that has the smallest weight, $w(c^*)$. The weight function $w(c)$ plays a fundamental role in determining the choice of check nodes to put in $U_1$. Different choices of the weight function will lead to different results. In our preferred embodiment, the weight function will be the degree of the check node. Another example of a good weight function is the sum of the degrees of the bit nodes that are connected to the check node. Choosing to use the degree of the check node as the weight function amounts to keeping all parts of the graph equally dense. Also, from the perspective of the $(n+1)^{th}$ bit node that is being added, this choice connects it to the check node that is least used. The next discussion explains how to make the choice more precise.

Initially, as a first try, a subset of $F_0$ is examined, namely $F_1$, which is defined by equation (5) in FIG. 4. $F_1$ is the set of check nodes in $F_0$ that have the smallest weight. As a first order heuristic, we may simply choose $c^*$ to be any element of $F_1$. These heuristics will be referred to as "1–h", meaning first-order homogeneity. It can be shown that this first-order heuristic already yields quite competitive codes (when using the 1–h, it might be preferable to use the sum of the degrees of the bits connected to the check node as the weight function).

Typically while $F_1$ is smaller than $F_0$, it does not uniquely determine a check node. To further narrow available choices, we look once more to homogeneity. The idea is to look at the degrees of check nodes that are two edges away from the check nodes in $F_1$. $F_2$ can be written as shown in No. eq. 6 in FIG. 4, where $V_2$ (.) is as in equation (4). Now we may try selecting a check node from $F_2$. H further narrow the set of choices, we may look at the degrees of check nodes that are four edges away from the check nodes in $F_1$, and can continue in this fashion. The basic idea can be described in the pseudocode listing shown in FIG. 5. The idea is to progressively look at larger and larger neighborhoods of the feasible check nodes in order to distinguish them. This heuristic is referred to as "c-h" for "complete homogeneity". The "while . . . endwhile" loop in line 9C–9I in FIG. 5 terminates when the set of choices reduces to a set of cardinality one, or until the set of choices does not further reduce cardinality. The set $E_j$ in line 9H contains all check nodes in $F_j$ such that their neighborhood can be further enlarged. The loop terminates if $E_j \neq F_j$, since in this case, the check nodes in $E_j$ are guaranteed to be less homogeneous than the check nodes in $F_j \backslash E_j$. Furthermore, since, using homogeneity as our guide, we cannot further distinguish between the elements of $F_j \backslash E_j$, we simply make some choice from this set. Specifically, we select the lexicographically smallest check node from this set.

The bit-filling technique of the present invention offers more flexibility in the code design parameters than conventional techniques. For example, one may choose to trade-off the bit error rate performance against the code rate. Furthermore, while the above discussion addressed the task of maximizing the girth given constraints on the number of check nodes, the number of bit nodes, the check-degree distribution, and the bit-degree distribution, the present invention can be used for cases where it is desirable to maximize the rate R given the number of check nodes m, and the bit-degree distribution $\{a\}$. The present invention can be adapted to this case as follows. Simply apply the algorithm with given parameters m, $\{a\}$, $\{b\}$, g, and some initial girth. Set N=infinity, and run the algorithm until g falls below g. The number of bit nodes allocated at that point is the maximum number of bit nodes achievable by the bit-filling algorithm.

Furthermore, the present invention can be used to maximize the rate given a fixed girth g and fixed length n, and fixed column weight distribution $\{a\}$. This is done by trying different values of m where g, n, and $\{a\}$ are fixed. This may be done in a binary search mode by selecting the smallest m that achieves the desired length.

The method described above can be used for any bit-degree distribution $\{a\}$ regardless of the ordering of the elements, $a_k$, in the sequence. However, the performance of the resulting LDPC codes depends on the order chosen. In our preferred embodiment, we order the bit degrees so that $a_1 \; a_2 \; \ldots \; a_n$. This ordering of the bit degrees during the construction process prevents the appearance of short cycles containing only bits with small degree in the resulting LDPC parity check matrix.

Consider FIG. 6. Let us define the graph Gn to be the graph associated to the parity check matrix after n bits have been allocated. Then the resulting sequence of graphs has the property that $\text{girth}(G_1) \geq \text{girth}(G_2) \geq \ldots \geq \text{girth}(G_N)$. Also, let $G(d)$ be the subgraph of graph G obtained be retaining only the nodes that have degree at most d. Let G be the graph corresponding to the final LDPC parity-check matrix output by the present bit-filling algorithm. If the bit degrees used for the bit-filling algorithm are ordered from smallest to largest as explained above in our preferred embodiment, i.e., $a_1 \leq a_2 \leq \ldots \leq a_n$, then it follows that $\text{girth}(G(1)) \geq \text{girth}(G(2)) \geq \ldots \geq D$ is the largest degree in G. That is, the graph G corresponding to the code that is generated by the bit-filling algorithm has the property that the subgraphs of G containing only bit nodes of small degree have large girth. More precisely, the graph G corresponding to the code that is generated by the bit-filling algorithm has the property that $\text{girth}(G(1)) \geq \text{girth}(G(2)) \geq \ldots \geq \text{girth}(G(D))$, where D is the largest degree in G. Moreover, in one non-limiting preferred embodiment the bit-filling starts with a large girth constraint, e.g., $g=g' \geq m/2+1$ to guarantee that no cycles are formed until it is impossible to add a bit without forming a cycle. That is, the graph starts out as a tree.

While the particular SYSTEM AND METHOD FOR GENERATING LOW DENSITY PARITY CHECK CODES USING BIT-FILLING as herein shown and described in detail is fully capable of attaining the above-described objects of the invention, it is to be understood that it is the presently preferred embodiment of the present invention and is thus representative of the subject matter which is broadly contemplated by the present invention, that the scope of the present invention fully encompasses other embodiments which may become obvious to those skilled in the art, and that the scope of the present invention is accordingly to be limited by nothing other than the appended claims, in which reference to an element in the singular is not intended to mean "one and only one" unless explicitly so stated, but rather "one or more". All structural and functional equivalents to the elements of the above-described preferred embodiment that are known or later come to be known to those of ordinary skill in the art are expressly incorporated herein by reference and are intended to be encompassed by the present claims. Moreover, it is not necessary for a device or method to address each and every problem sought to be solved by the present invention, for it to be encompassed by the present claims. Furthermore, no element, component, or method step in the present disclosure is intended to be dedicated to the public regardless of whether the element, component, or method step is explicitly recited in the claims. No claim element herein is to be construed under the provisions of 35 U.S.C. §112, sixth paragraph, unless the element is expressly recited using the phrase "means for" or "steps for".

What is claimed is:

1. A computer-implemented method for generating low-density parity check (LDPC) codes comprising:

(a) constructing an m×n matrix H having m rows of check nodes and n columns of bit nodes, wherein the $j^{th}$ column has weight $a_j$, each row, r, has a weight at most $b_r$, the matrix H is representable by a Tanner graph having a girth g;

(b) iteratively adding an $(n+1)^{th}$ column ($U_1$) to matrix H, wherein the size of $U_1$ is initially empty and is at most $a_{n+1}$, and wherein $U_1$ comprises a set of i check nodes such that i is greater than or equal to 0 and i is less than $a_{n+1}$;

(c) iteratively adding check nodes to $U_1$ such that each check node does not violate predetermined girth constraint g, and check-degree constraint deg (c)<b(c);

(d) updating matrix H when a new column is added; and (e) terminating the iterations if there are no new check nodes that do not violate the girth and check-degree constraints.

2. The method according to claim 1 wherein the predetermined girth constraint is that the added check node does not create any cycles of length g-2 or smaller and wherein the predetermined check-degree constraint is that each check node, c, be a member of the set of check nodes that are connected to fewer than b(c) bit nodes, and wherein step (b) maximizes the rate of the matrix H, defined as (n−m)/n.

3. The method according to claim 2 wherein steps (b), (c), (d), and (e) are performed according to at least one union process.

4. The method according to claim 3 wherein step (c) is performed according to at least one predefined process.

5. The method according to claim 1 further comprising:

generating a Tanner graph based on the parity check matrix H having m check nodes and n bit nodes; and step (c) includes selecting check nodes that are the least used up to that point, wherein the Tanner graph is kept as homogeneous as possible.

6. The method according to claim 1 wherein said predetermined girth constraint includes the constraint that the girth must be a fixed value.

7. The method according to claim 1 wherein said predetermined girth constraint is to maximize the girth, and wherein step (c) adds check nodes that do not violate an additional constraint that the rate is a fixed value, rate being defined as (n−m)/n.

8. An LDPC code generator for creating LDPC codes for use in an LDPC error correcting system, the LDPC error correcting system including an LDPC encoder that receives digital data and encodes said data using the LDPC codes, the LDPC code generator comprising:

processing module for generating an m×n matrix H having m rows of check nodes and n columns of bit nodes, wherein the respective weight of each respective jth column is $a_j$, no row, c, has a weight greater than b(c), and wherein the matrix H can be represented by a Tanner graph that has a girth of at least g;

processing module for iteratively adding $(n+1)^{th}$ columns ($U_1$) to matrix H, wherein the size of $U_1$ is initially empty and is at most $a_{n+1}$, and wherein $U_1$ comprises a set of i check nodes such that i is greater than or equal to 0 and i is less than $a_{n+1}$;

processing module for iteratively adding check nodes to $U_1$ such that each check node does not violate predetermined girth and check-degree constraints;

processing module for updating matrix H when a new column is added; and processing module for decrementing the girth constraint if there are no new check nodes that do not violate the current girth constraint.

9. The LDPC code generator according to claim 8 wherein the predetermined girth constraint is that the added check node does not create any cycles of length g-2 or smaller and wherein the predetermined check-degree constraint is that the check node, c, be a member of the set of check nodes that are connected to fewer than b(c) bit nodes, and wherein the processing module for iteratively adding columns maximizes the rate of the matrix H, the rate being defined as (n−m)/n.

10. The LDPC code generator according to claim 8 wherein said predetermined girth constraint is to maximize the girth such that no iteration can be formed until it is impossible to add a bit node without forming an iteration, wherein $U_1$ begins as a tree.

11. The LDPC code generator according to claim 10 wherein the processing module for iteratively adding check nodes implements a union process.

12. The LDPC code generator according to claim 8 further comprising:

processing module for generating a Tanner graph based on the parity check matrix H having m check nodes and n bit nodes; and the processing module for iteratively adding check nodes selects check nodes that are the least used up to that point, wherein the Tanner graph is kept as homogeneous as possible.

13. The LDPC code generator according to claim 8 wherein said predetermined girth constraint includes the constraint that the girth must be bigger or equal to a fixed value.

14. The LDPC code generator according to claim 8 wherein said predetermined girth constraint is to maximize the girth, and wherein the processing module for iteratively adding check nodes adds check nodes that do not violate [the] an additional constraint that the rate is a fixed value, the rate being defined as (n−m)/n.

15. A computer program product, comprising:

a computer program storage device;

computer-readable instructions on the storage device for causing a computer to undertake method acts to facilitate the generation of LDPC codes, the method acts comprising:

a) constructing an m×n matrix H having m rows of check nodes and n columns of bit nodes, wherein the weight of each column is $a_{n+1}$, and no row, c, has a weight greater than b(c) and wherein the matrix H can be described by a Tanner graph having a girth of at least g;

b) iteratively adding an $(n+1)^{th}$ colunm ($U_1$) to matrix H, wherein the size of $U_1$ is initially empty and is at most a, and wherein $U_1$ comprises a set of i check nodes such that i is greater than or equal to 0 and i is less than a;

(c) iteratively adding check nodes to $U_1$ such that each check node does not violate predetermined girth and check-degree constraints;

(d) updating matrix H when a new column is added; and (e) terminating the iterations if there are no new check nodes that do not violate the girth and check-degree constraints.

16. The computer program product according to claim 15 wherein the predetermined girth constraint is that the added check node does not create any cycles of length g-2 or smaller, and wherein the predetermined check-degree constraint is that the check node be a member of the set of check nodes that are connected to fewer than b bit nodes, and wherein step (b) maximizes the rate of the matrix H, defined as $(n-m)/n$.

* * * * *